United States Patent
Moschiano

(10) Patent No.: US 11,450,379 B2
(45) Date of Patent: Sep. 20, 2022

(54) ULTRA-COMPACT PAGE BUFFER

(71) Applicant: Micron Technology, Inc., Boise, ID (US)

(72) Inventor: Violante Moschiano, Avezzano (IT)

(73) Assignee: Micron Technology, Inc., Boise, ID (US)

(*) Notice: Subject to any disclaimer, the term of this patent is extended or adjusted under 35 U.S.C. 154(b) by 6 days.

(21) Appl. No.: 17/247,437

(22) Filed: Dec. 10, 2020

(65) Prior Publication Data

US 2022/0189529 A1 Jun. 16, 2022

(51) Int. Cl.
| | |
|---|---|
| G11C 11/4091 | (2006.01) |
| G11C 11/4096 | (2006.01) |
| H03M 1/00 | (2006.01) |
| G11C 11/4076 | (2006.01) |
| G11C 27/02 | (2006.01) |
| G11C 11/4074 | (2006.01) |

(52) U.S. Cl.
CPC ...... *G11C 11/4091* (2013.01); *G11C 11/4074* (2013.01); *G11C 11/4076* (2013.01); *G11C 11/4096* (2013.01); *G11C 27/024* (2013.01); *H03M 1/001* (2013.01)

(58) Field of Classification Search
CPC .................................................. G11C 19/34
See application file for complete search history.

(56) References Cited

U.S. PATENT DOCUMENTS

| | | | | |
|---|---|---|---|---|
| 5,638,320 | A * | 6/1997 | Wong | G11C 11/5621 365/185.21 |
| 5,745,409 | A * | 4/1998 | Wong | G11C 27/005 365/45 |
| 8,355,500 | B2 * | 1/2013 | Perrine | H04L 9/08 380/28 |
| 10,891,080 | B1 * | 1/2021 | Bayat | G11C 27/02 |
| 2002/0158620 | A1 * | 10/2002 | Sunter | G01R 31/3167 324/76.15 |
| 2005/0140625 | A1 * | 6/2005 | Kim | G09G 3/3688 345/89 |
| 2006/0028367 | A1 * | 2/2006 | Kim | G11C 7/16 341/144 |
| 2018/0130539 | A1 * | 5/2018 | Ikeda | G11C 11/4087 |
| 2018/0211620 | A1 * | 7/2018 | Kurokawa | G06N 3/084 |
| 2020/0160917 | A1 * | 5/2020 | Kitani | G11C 16/10 |
| 2021/0124793 | A1 * | 4/2021 | Wang | G11C 11/54 |

* cited by examiner

*Primary Examiner* — Douglas King
(74) *Attorney, Agent, or Firm* — Lowenstein Sandler LLP

(57) ABSTRACT

A device includes a memory array and a sense amplifier (SA) coupled with the memory array and with an input/output (I/O) data line. The SA is to receive bits of data over the I/O data line in association with a program operation. A digital-to-analog converter (DAC) is coupled with the SA, the DAC to convert the bits of data to an analog voltage value. An analog memory element is coupled with the DAC, the analog memory element to store the analog voltage value for a period of time until the bits of data are programmed to the memory array.

18 Claims, 12 Drawing Sheets

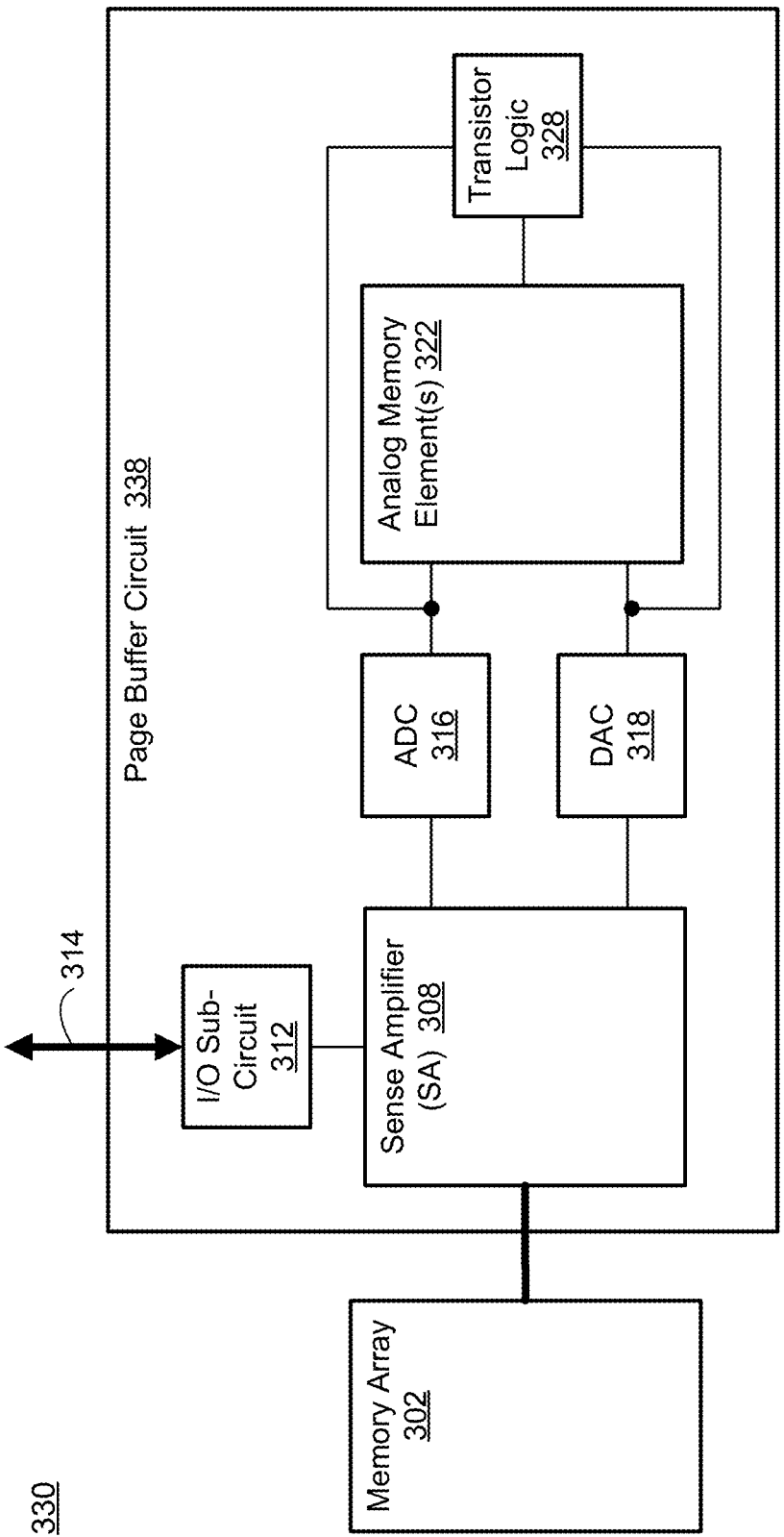

ULTRA-COMPACT PAGE BUFFER

TECHNICAL FIELD

Embodiments of the disclosure are generally related to memory sub-systems, and more specifically, relate to an ultra-compact page buffer of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3A is an example page buffer circuit of one of the memory devices of FIGS. 1-2, in accordance with some embodiments.

DETAILED DESCRIPTION

Figure 1:
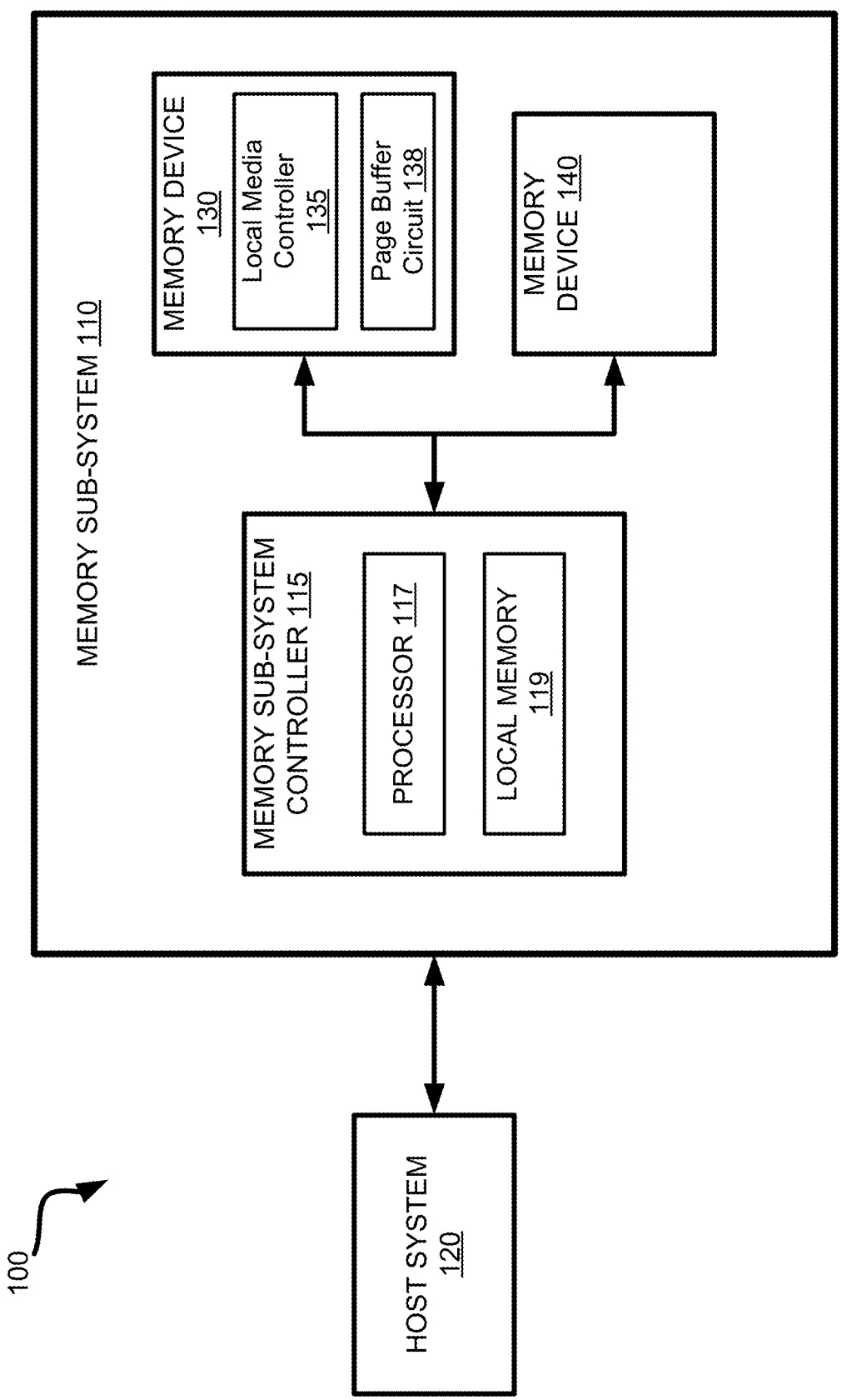
FIG. 1 illustrates an example computing system that includes a memory sub-system in accordance with some embodiments.

Embodiments of the present disclosure are directed to an ultra-compact page buffer of a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. A non-volatile memory device is a package of one or more dice. Each die can include of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

In certain memory sub-systems it is common to receive a request to perform a memory access operation, such as a program operation of data from a host system to a memory array of a memory device, and then to subsequently receive a request to perform another memory access operation, such as a read operation, on that same data from the host system. The memory device being programmed includes a number of page buffers (also referred to as page cache).

Data being programmed is stored in a page buffer circuit while the data is written to the appropriate cells of the memory array. Furthermore, when a multi-pass programming scheme is used, certain page types of a given memory cell can be programmed at different times. For example, a quad-level cell (QLC) memory cell can have a total of four logical pages, including a lower logical page (LP), an upper logical page (UP), an extra logical page (XP) and a top logical page (TP), where each logical page stores a bit of data. Depending on the programming scheme, the LP can be programmed on one pass for example, and the UP, XP and TP can be programmed on a second pass. Other programming schemes are possible. In this example, however, prior to programming the UP, XP, and TP in the second pass, the data from the LP can first be read from the memory cell and can be stored in the page buffer circuit of the memory device. In this way, the page buffer circuit holds a certain amount of data to be programmed to the memory array or that is being read out of the memory array.

In certain memory devices, to add an additional plane of memory requires adding eight pages, each 64 kilobytes (KB)

in size, so this adds a significant additional page buffer area to accommodate the additional plane of memory. For example, each page buffer circuit of a memory device includes a sense amplifier, which includes a latch, a capacitor, other circuitry, memory elements, and elaborators. The memory elements can be digital memory elements such as dynamic random access memory (DRAM), static random access memory (SRAM), or the like memory elements for storing data bits. The page buffer circuit also includes an input/output (I/O) sub-circuit having a latch and column-selection circuitry. This page buffer area is expanding in memory devices as the memory devices grow in size, thus the page buffer area can be an obstacle to manufacturing larger memory devices and components.

Aspects of the present disclosure address the above and other deficiencies by reducing the size of page buffer circuits, thus freeing up space for additional memory cells, as in NAND-type or other types of memory arrays, for example. One way to reduce the size of page buffer circuits is to reduce the number of digital memory elements (e.g., data registers) required to buffer data that is being written to or read from the memory array. In various embodiments, two or more (e.g., multiple) digital memory elements in a page buffer circuit are replaced by a single analog memory element, which can store multiple different analog voltage values (or states) that correspond to multiple different digital values or states, e.g., of multiple data bits. Further, logic of the page buffer circuit is configured to discriminate the data bits associated with the voltage value stored on the analog memory element, e.g., in performing digital-to-analog and analog-to-digital conversion between the data bits and the voltage values (or states).

In one embodiment, the analog memory element is a capacitor. In another embodiment, the analog memory element is a power cell or an energy cell that stores energy at a level commensurate with the analog voltage value or state that corresponds to the digital bits stored (or to be stored) in the memory array. The disclosed page buffer circuit can also include a digital-to-analog converter (DAC) to convert data bits to analog voltage values that are to be temporarily stored in the analog memory element. Further, the page buffer circuit can also include an analog-to-digital converter (ADC) to convert the analog voltage values of the analog memory element to data bits that are to be stored in the memory array or read out through an I/O data line of the I/O sub-circuit. In some embodiments, the circuitry of the DAC and ADC have overlapping components and thus, need not take up much space compared to the digital memory elements that are being replaced by the analog memory element.

Therefore, advantages of the systems and methods implemented in accordance with some embodiments of the present disclosure include, but are not limited to, reduction of page buffer circuits that reduce the page buffer area of a memory device by between 40-50% or more, without additional latency or performance degradation. This is a significant reduction in overhead from page buffer circuits that will allow the memory array area to grow without such a significant additional overhead of the page buffer area. Other advantages will be apparent to those skilled in the art of managing thermal-related operations within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device. In various embodiments, the memory devices 130 include a page buffer circuit 138 to temporarily store (e.g., buffer) data before being stored in the memory devices 130 or before being read out of the memory devices 130. Numerous area-saving enhances to the page buffer circuit 138 (or similar types of page cache) will be discussed in more detail hereinafter.

Figure 2:
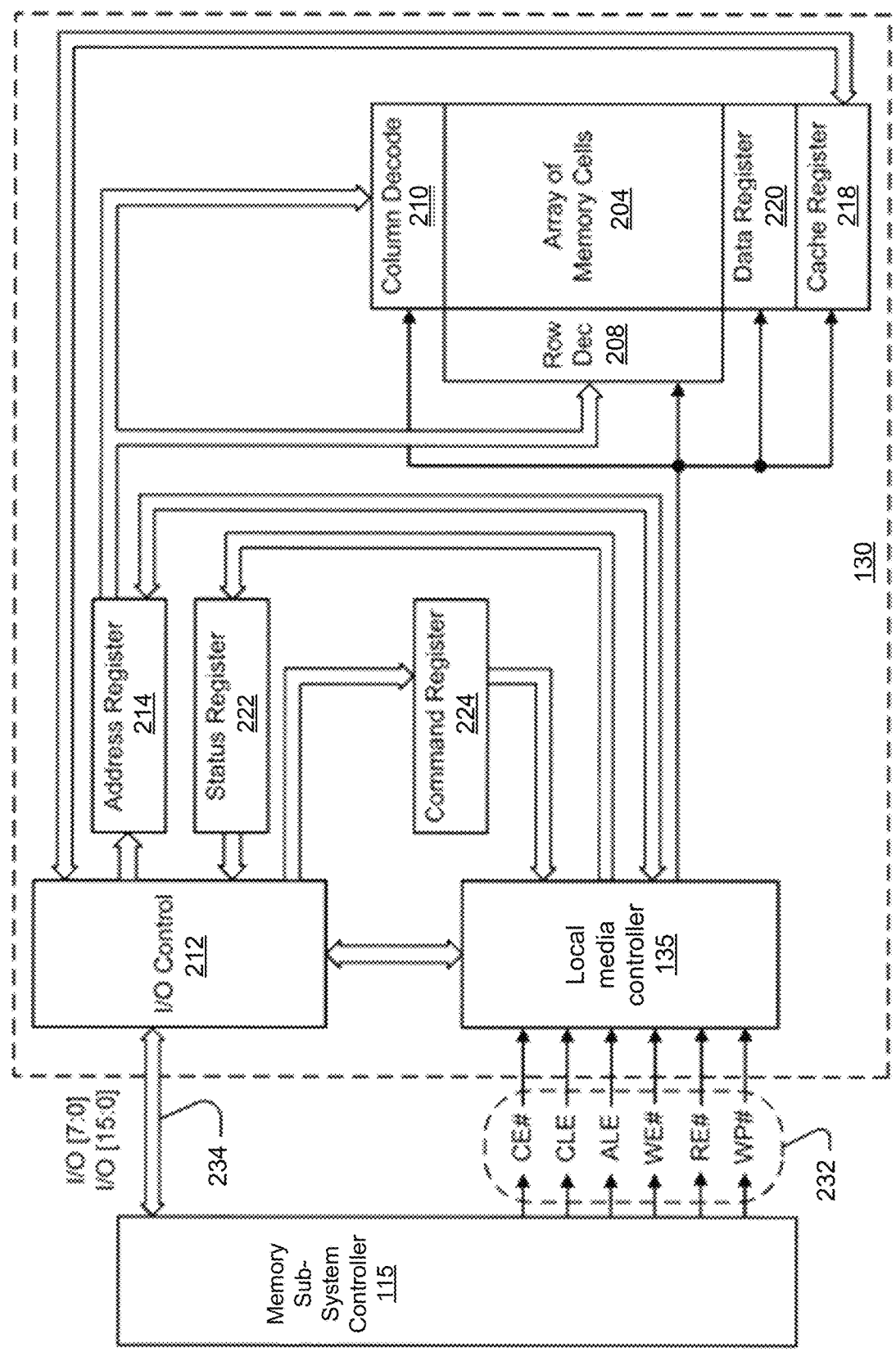
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic of the local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data can be passed from the cache register 218 to the data register 22 for transfer to the array of memory cells 204; then new data can be latched in the cache register 218 from the I/O control circuitry 212. During a read operation, data can be passed from the cache register 218 to the I/O control circuitry 212 for output to the memory sub-system controller 115; then new data can be passed from the data register 220 to the cache register 218. The cache register 218 and/or the data register 220 can form (e.g., can form a portion of) a page buffer of the memory device 130. A page buffer can further include sensing devices (not shown in FIG. 2) to sense a data state of a memory cell of the array of memory cells 204, e.g., by sensing a state of a data line connected to that memory cell. A status register 222 can be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable (CE#), a command latch enable (CLE), an address latch enable (ALE), a write enable (WE#), a read enable (RE#), and a write protect (WP#). Additional or alternative control signals (not shown) can be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands can be received over input/output (I/O) pins [7:0] of I/O bus 234 at I/O control circuitry 212 and can then be written into command register 224. The addresses can be received over input/output (I/O) pins [7:0] of I/O bus 234 at I/O control circuitry 212 and can then be written into address register 214. The data can be received over input/output (I/O) pins [7:0] for an 8-bit device or input/output (I/O) pins [15:0] for a 16-bit device at I/O control circuitry 212 and then can be written into cache register 218. The data can be subsequently written into data register 220 for programming the array of memory cells 204.

In an embodiment, cache register 218 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) can be used in the various embodiments.

FIG. 3A is an example page buffer circuit 338 of one of the memory devices 130, of FIGS. 1-2, e.g., a memory device 330, in accordance with some embodiments. In various embodiments, the memory device 330 includes a memory array 302 and the page buffer circuit 338. In some embodiments, the page buffer circuit 338 is the page buffer circuit 128 of FIG. 1.

In these embodiments, the page buffer circuit 338 includes a sense amplifier (SA) 308 coupled with the memory array 302, an I/O sub-circuit 312 coupled with the SA 308, one or more analog memory element(s) 322, and transistor logic 328. The page buffer circuit 338 can further include an ADC 316 coupled between the SA 308 and the one or more analog memory element(s) 322 and a DAC 318 coupled between the SA 308 and the analog memory element 322. The transistor logic 328 can also be coupled with the ADC 316 and the DAC 318.

In one embodiment, the analog memory element 322 is a capacitor, such as a high capacity capacitor. The capacitor can be a discrete component, such as attached to a printed circuit board (PCB), or an integrated component formed within the substrate of chip or die that underlies the page buffer circuit 338 in differing embodiments. In another embodiment, the analog memory element 322 is a power cell or an energy cell that stores energy at a level commensurate with the analog voltage value or state that corresponds to the digital bits stored (or to be stored) in the memory array 302.

The memory device 330 can further include an I/O data line 314 coupled with the I/O sub-circuit 312. In one embodiment, the I/O data line 314 is coupled with a local media controller, such as the local media controller 135, to exchange data bits with the host system 120, for example, by execution of program operations and read operations. Further, in one embodiment, the I/O sub-circuit 312 is a part of or integrated within the SA 308, an example of which is illustrated in FIG. 3B.

In some embodiments, the SA 308 receives bits of data over the I/O data line 314 in association with a program operation, e.g., using the I/O sub-circuit 312. The DAC 318 converts the bits of data to an analog voltage value. The analog memory element(s) 322 store the analog voltage value for a period of time until the bits of data are programmed to the memory array 302. The bits of data, in one embodiment, are of a page of data to be stored in the memory array 302. For example, the ADC 316 can, after the period of time, convert the analog voltage value to the bits of data so that the SA 308 can then program the bits of data to the memory array 302.

In some embodiments, the SA 308 retrieves bits of data from the memory array 302 in response to a memory operation. The DAC 318 converts the bits of data to an analog voltage value. The analog memory element(s) 322 store the analog voltage value for a period of time until the bits of data are transmitted out to the I/O data line 314, e.g., using the I/O sub-circuit 312. The bits of data, in one embodiment, are of a page of data previously stored in the memory array 302. For example, the ADC 316 can, after the period of time, convert the analog voltage value to the bits of data so that the SA 308 can transmit the bits of data out via the I/O data line 314.

Figure 3B:
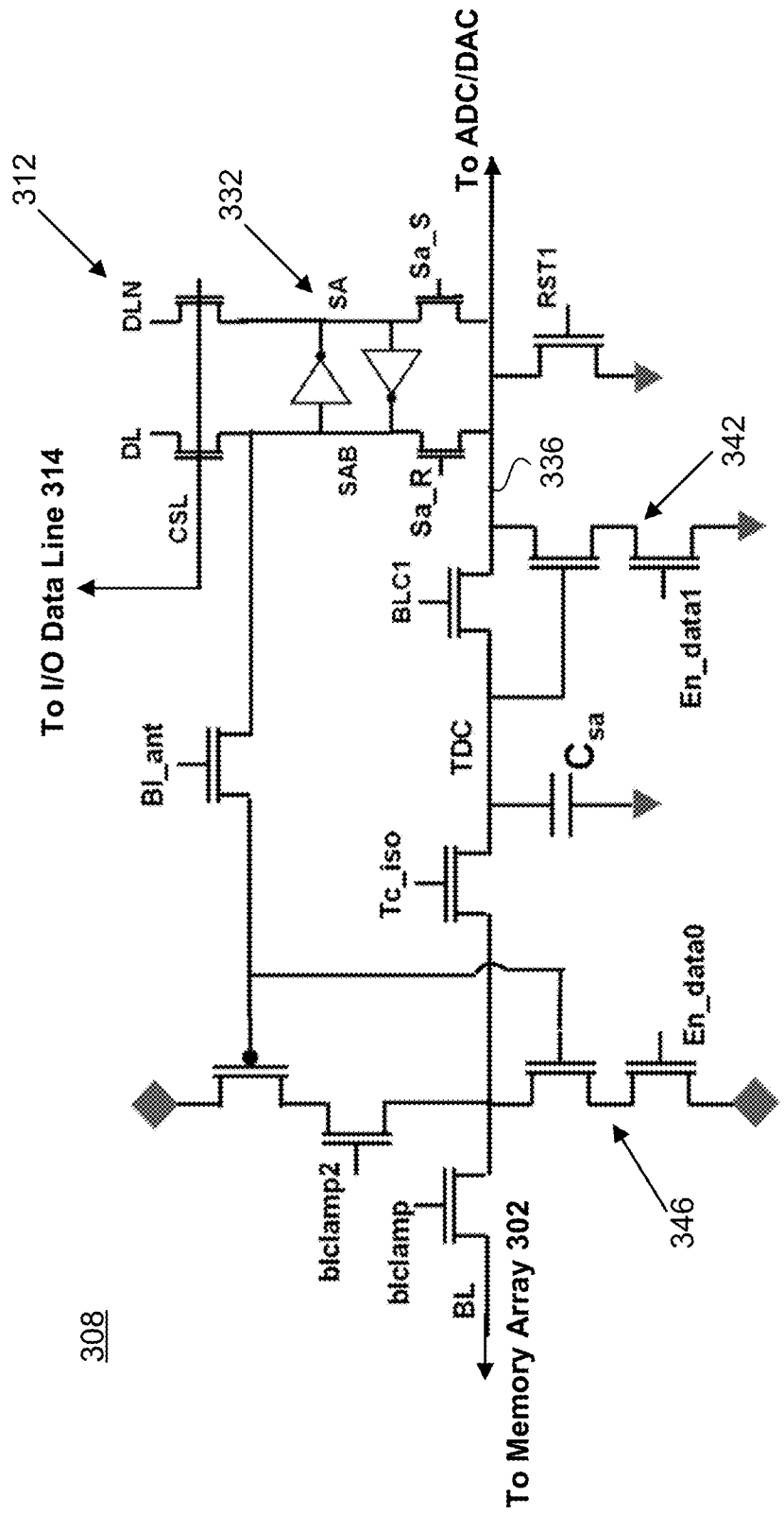
FIG. 3B is an example sense amplifier (SA) of the page buffer circuit of FIG. 3A, in accordance with some embodiments.

FIG. 3B is an example sense amplifier (SA) 308 of the page buffer circuit 338 of FIG. 3A, in accordance with some embodiments. The SA 308 can sense low power signals from a bitline that represents a data bit (1 or 0) stored in a memory cell of the memory array 302, and amplify the small voltage swing to recognizable levels so the data can be interpreted properly by logic outside of the memory. The SA 308 can further reverse this operation for data bits received over the I/O data line 314 to program the data bits to a memory cell of the memory array 302.

In this embodiment, the I/O sub-circuit 312 can be integrated into the SA 308. The I/O sub-circuit 312, for example, can include a pair of gate-connected transistors (DL and DLN) coupled to the I/O data line 314, e.g., via a common sense line (CSL). Sources of these gate-connected transistors can be coupled with a latch 332 of the SA 308. The latch 332 can sense and hold the incoming bits (e.g., digital values) between two sense amplifier terminals (SAB and SA).

The latch 332, for example, can be a set/reset, or SR latch, or a bistable multivibrator capable of holding two states, e.g., one state that can be equivalent to a zero ("0") and another state that is equivalent to a one ("1"). The latch 332 can include, for example, a pair of mutually-coupled transistors, Sa_R and Sa_S, respectively. In one embodiment, when the Sa_S gate goes high, the latch 332 outputs a high voltage to a digital data line 336 of the SA 308. Conversely, when the Sa_R gate goes high, the latch 332 outputs a low voltage to the digital data line 336.

A reset transistor (RST1), coupled with sources of the mutually-coupled transistors, can be selectively activated to discharge the voltage on the digital data line 336. The transistors referred to herein are, unless otherwise stated, n-type metal-oxide semiconductor (NMOS) devices. The SA 308 can further include a sense amplifier capacitor ($C_{sa}$) on which to store each respective bit of data as the bit is being programmed to the memory array 302 or read out of the memory 302 along a bitline (BL) that is coupled with the digital data line 336. The other transistors illustrated in the SA 308 of FIG. 3B support the retention, power supply delivery, and programming of the bits to the memory array 302.

For example, a bit line capacitor transistor (BLC1) can be interposed between the digital data line 336 and the $C_{sa}$, together with a second set of enable transistors 342, can act to pass the data bits from the digital data line 336 to be stored on the $C_{sa}$ for programming. A first set of enable transistors 346 can, together with a Tc_iso transistor, can operate to pass the bits from the $C_{sa}$ to the bitline.

Figure 3C:
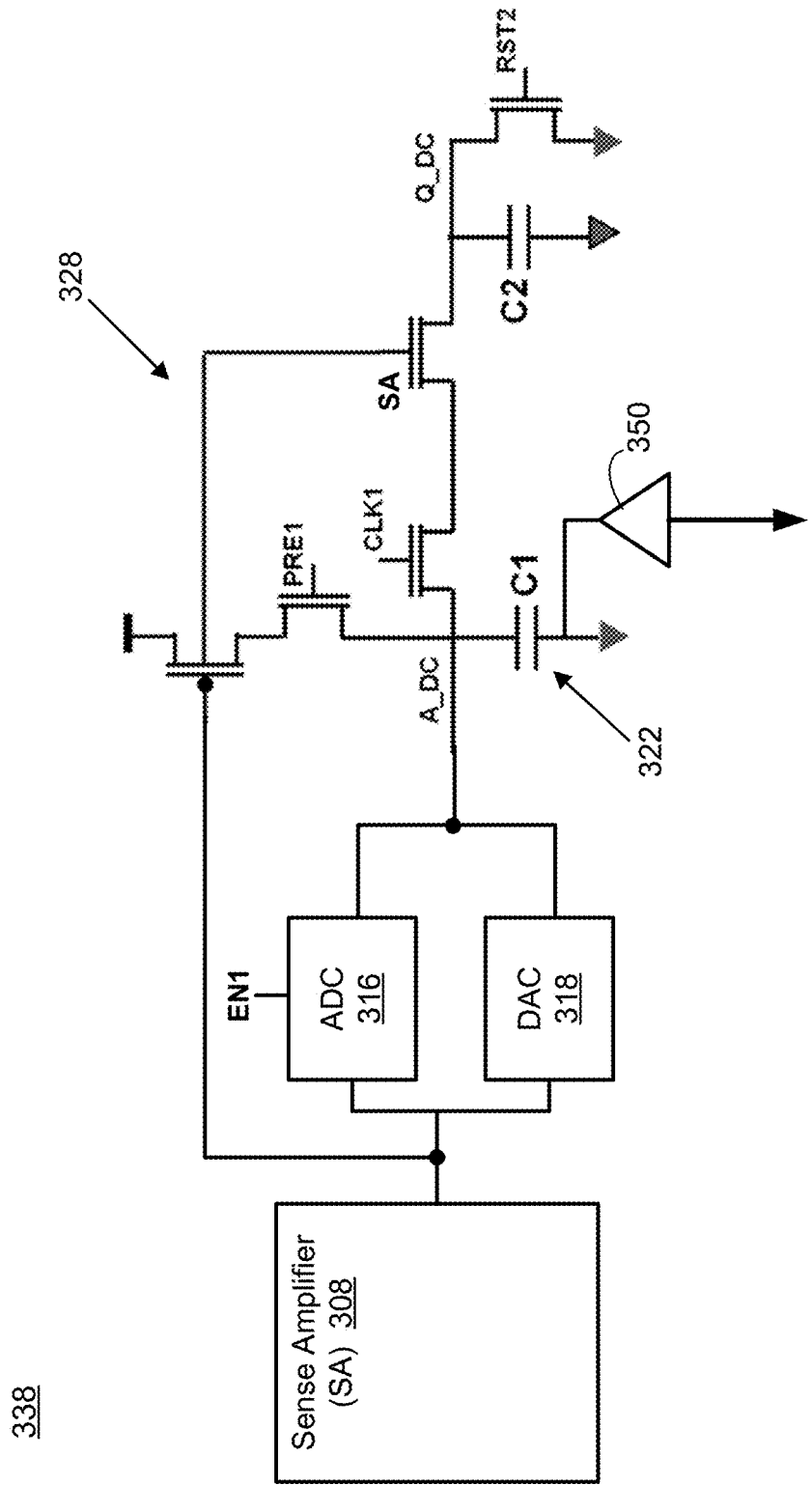
FIG. 3C is an example analog memory element and transistor logic of the page buffer circuit of FIG. 3A, in accordance with some embodiments.

FIG. 3C is an example of the analog memory element 322 and the transistor logic 328 of the page buffer circuit 338 of FIG. 3A, in accordance with some embodiments. For example, in one embodiment, the analog memory element 322 is a first capacitor (C1) that is of higher capacity, such as between approximately 7 and 9 femtofarads (ff), e.g., 8 ff. The first capacitor, C1, can be a discrete component, such as attached to a printed circuit board (PCB), or an integrated component formed within (e.g., located in) the substrate of an integrated circuit device that underlies the page buffer circuit 338 in differing embodiments.

The ADC 316 and the DAC 318 can be coupled to C1 via an analog direct current (A_DC) line. Further, a pre-charge transistor (PRE1) can be coupled with a voltage supply and the first capacitor, the pre-charge transistor to charge the first capacitor to an initial voltage level. The analog memory elements 322 can further include a second capacitor (C2) coupled in parallel with the first capacitor (C1) and being approximately four to 20 times smaller than the first capacitor. For example, in one embodiment, the second capacitor is between 0.5 and 2 ff, e.g., 1 ff.

In some embodiments, the page buffer circuit 338 includes the transistor logic 328 coupled between the first capacitor (C1) and the second capacitor (C2). The transistor logic 328 is to selectively enable the second capacitor (C2) to consume charge from the first capacitor (C1) until the first capacitor stores the analog voltage value that represents the digital bits sensed by the sense amplifier. This process will be discussed in more detail with reference to FIG. 3.

In on embodiment, the transistor logic 328 includes a clock-enabled transistor (CLK1) and an SA-enabled transistor (SA). When these transistors are turned ON, the charge on C1 equalizes onto to C2, causing the voltage on C1 to be reduced by a quantity of charge (Q_DC), e.g., the consumed charge. The transistor logic 328 can further include a discharge transistor (RST2) coupled with the second capacitor (C2) to discharge the second capacitor of the consumed charge from the first capacitor.

In some embodiments, the transistor logic 328 further includes a boost device 350 that is coupled with the first capacitor (C1) and designed to provide a voltage boost to the charge stored on C1. The boost device 350 can be a p-type MOS (PMOS) device, a diode, or the like device that can provide an amount of voltage charge to C1. The voltage charge provided by the boost device 350 can enable raising the analog voltage value stored on the first capacitor (C1) a set amount depending on voltage level (L0-L7) when sending the analog voltage value to the SA 308 to properly interpreted by the SA 308. For example, the boost to C1 can compensate for a threshold voltage (Vth) of a main transistor of the ADC 316 (see FIG. 6). The voltage levels such as L0-L7 can be understood to correspond to one or more logical states of the memory cells.

Figure 4:
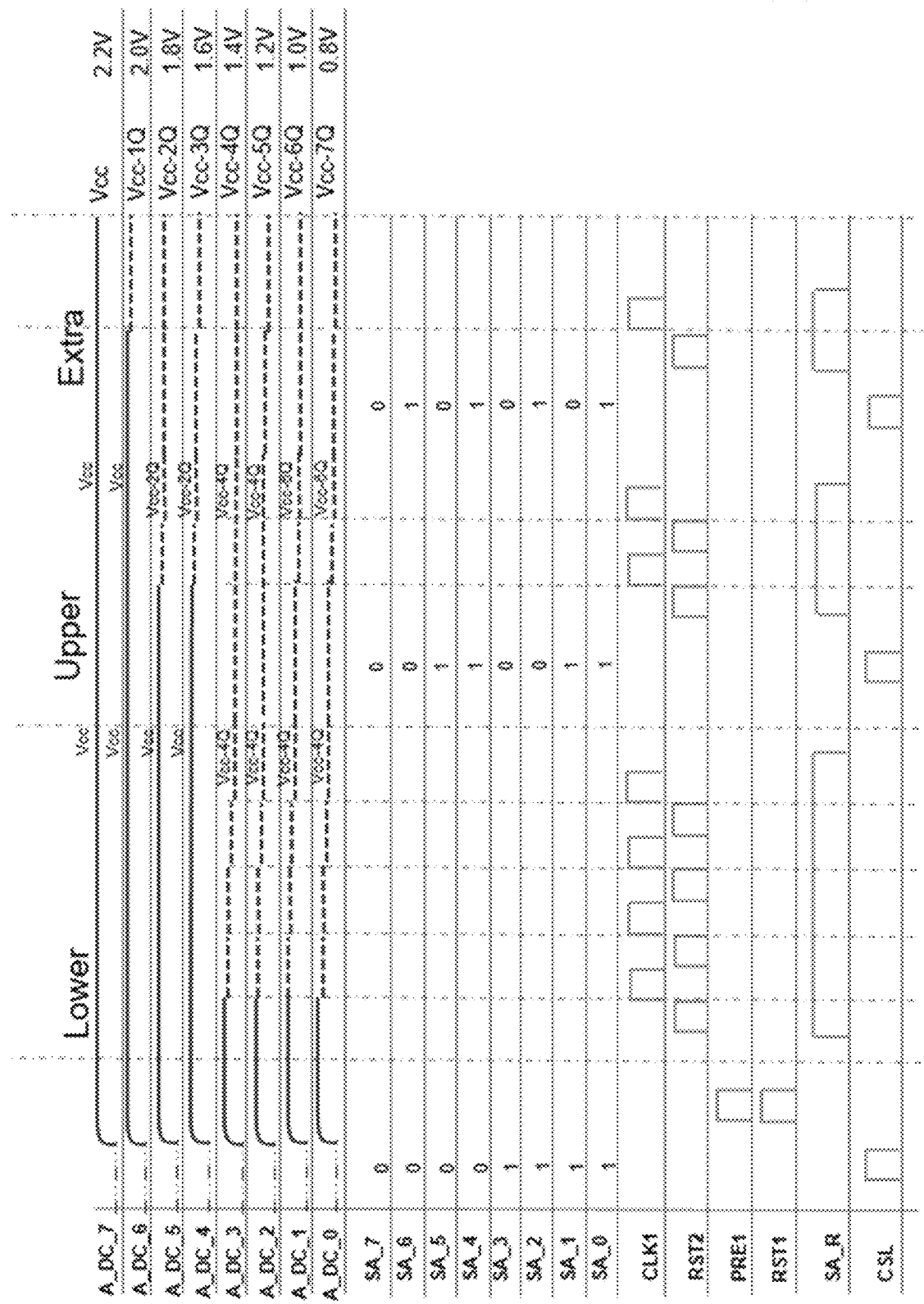
FIG. 4 is a set of corresponding timing graphs that correlate SA signals at the transistor logic with clock signals and analog signal values within the page buffer circuit of FIGS. 3A-3C, in accordance with some embodiments.

FIG. 4 is a set of corresponding timing graphs that correlate SA signals at the transistor logic with clock signals and analog signal values within the page buffer circuit of FIGS. 3A-3C, in accordance with some embodiments. The top part of the graph illustrate how the analog voltage value (A_DC) for different voltage levels (L0 through L7) can be stored in a multi-level cells (MLC), for example. As discussed, this analog voltage value takes the place, in this example, of three bits, and thus replaces three digital registers and thus significant page buffer area. In one embodiment, a representation of a quantity of charge (e.g., 1Q) is 0.2V, which can be the charge that C2 is able to consume. Thus, a supply voltage of 2.2V can be equal to a highest analog voltage value (A_DC_7), a next lowest voltage value (A_DC_6) is 2.0V, or 0.2V lower than the highest analog voltage value, and so forth through each of the eight analog voltage values (A_DC_7 through A_DC_0) associated with the threshold voltage values L0 through L7. The digital values (SA_7 through SA_0) listed below the analog voltage values illustrate corresponding values detected by the SA 308 for the corresponding analog voltage value that is stored to the first capacitor (C1).

With additional reference to FIG. 4, the waveforms at the bottom of the graph illustrate different signal values within the SA 308 and the transistor logic 328 of the page buffer circuit 338, including at CLK1, RST2, PRE1, RST1, SA_R, and CSL, which were introduced previously. In one embodiment, after data comes in on the CSL line, the PRE1 signal can pre-charge C1 to an initial voltage value (e.g., to 2.2V) and RST1 can pre-discharge the latch 332. This puts the page buffer circuit 338 in an initial set of states and ready to operate. The RST2 signal can then discharge C2 during an off clock cycle (e.g., before CLK1 goes high) as C2 operates to discharge C1 in steps of the quantity of charge, 0.2V in this example, although other charge quantity steps are envisioned.

Figure 5:
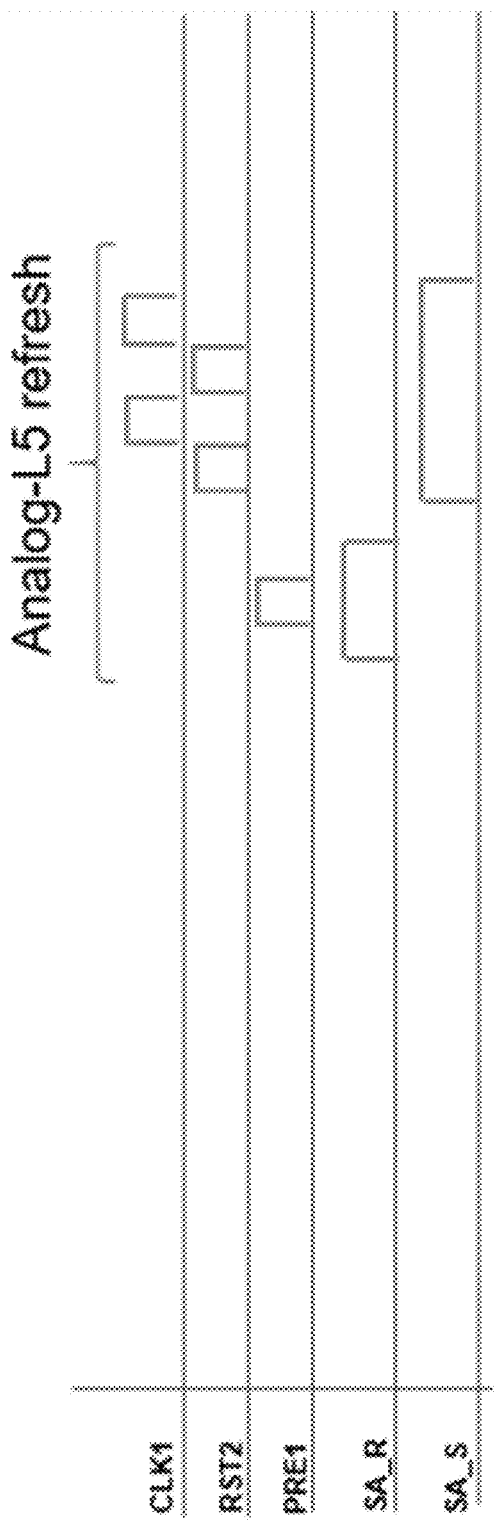
FIG. 5 is a timing chart and corresponding set of digital and analog values illustrating an example refresh operation for a voltage level five (L5) value stored on the analog memory component, in accordance with one embodiment.

FIG. 5 is a timing chart and corresponding set of digital and analog values illustrating an example refresh operation for a threshold voltage level five (L5) value stored on the analog memory component, in accordance with one embodiment. The analog voltage value stored in the first capacitor (C1) can be refreshed once every time period such as every 100 microseconds (μs), for example, to ensure the capacitor charge is not diminished below a threshold value of variance that would cause the analog voltage value to now correspond to the wrong digital value or state. In some embodiments, the time period of refreshing can change with temperature, such as something closer to 30 μs at 130° F. compared to 100 μs at 90° F. These values and time periods can be adjusted to different values.

In one embodiment, the refresh operation is performed by converting the analog voltage value back to the digital value or state that is held in the SA 308, and then back again to the analog voltage value, which is then restored to the first capacitor, C1. While FIG. 5 illustrates a refresh of an analog voltage value associated with L5, the transistor logic 228 can cause a refresh of each of the analog voltage values associated with the threshold voltage values (L1-L7), in turn, to cause a refresh of the UP and XP of the memory cell.

Figure 6:
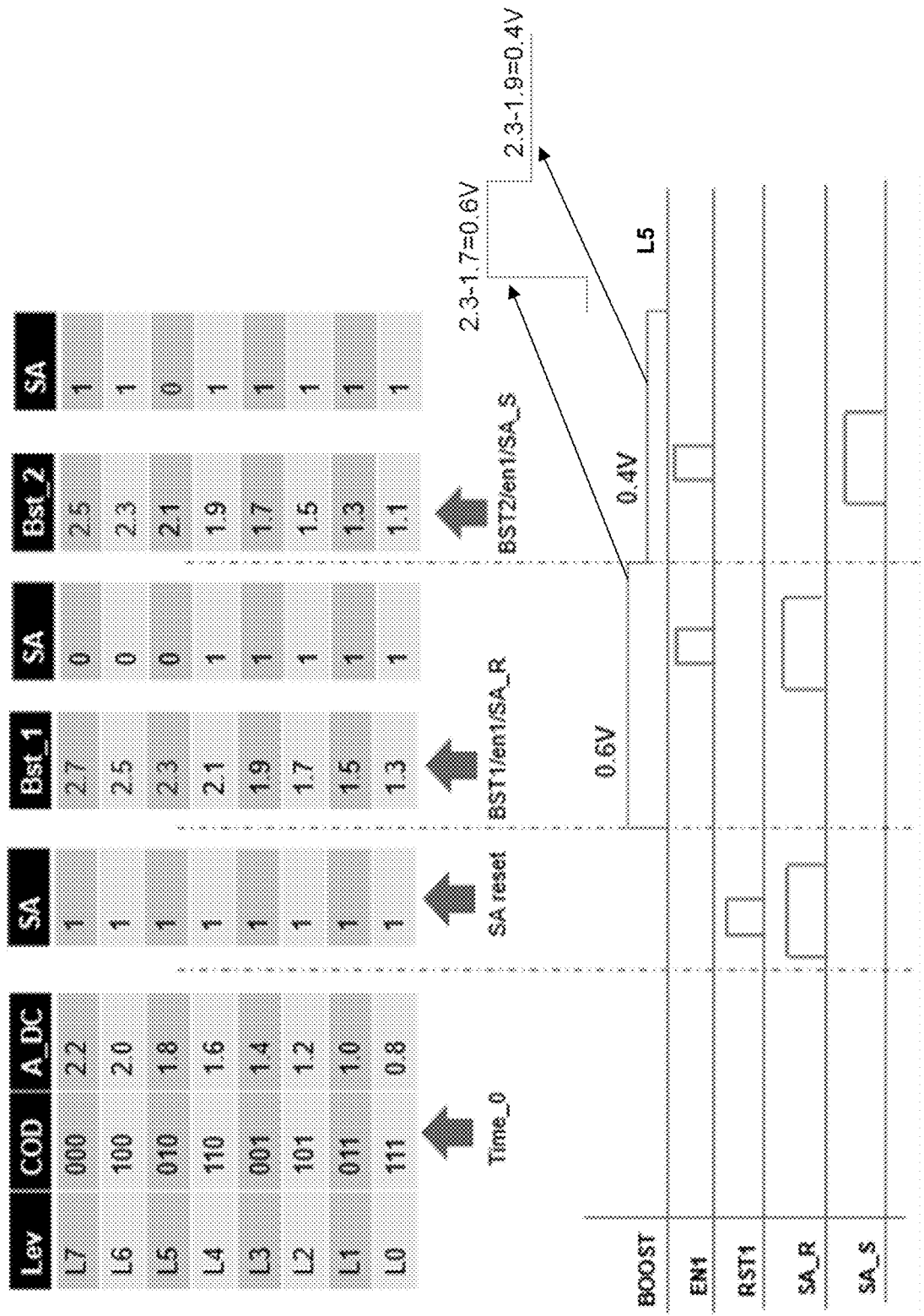
FIG. 6 is a timing chart and corresponding set of digital and analog values illustrating an example analog-to-digital (A2D) conversion of a value stored in the analog memory component, in accordance with some embodiments.

FIG. 6 is a timing chart and corresponding set of digital and analog values illustrating an example analog-to-digital (A2D) conversion of a value stored in the analog memory component, in accordance with some embodiments. From left to right, first illustrated are the analog voltage values (A_DC) at time zero (Time_0) corresponding to the voltage values L0-L7. As time progresses across the timing chart, the SA 308 can be reset by asserting the RST1 and SA_R signals, followed by consecutive boosts of the analog voltage value on C1 to update the corresponding digital value or state of the bit in the SA 308. The timing chart illustrates boost values to the fifth threshold voltage value (L5) of the multiple possible digital states.

The voltage charge provided by the boost device 350, as discussed with reference to FIG. 3C, can enable raising the analog voltage value stored on the first capacitor (C1) a set amount depending on voltage level (L0-L7) when sending the analog voltage value to the SA 308 to properly interpreted by the SA 308. For example, the boost to C1 can compensate for a threshold voltage (Vth) of a main transistor of the ADC 316, which can be 2.3V in one embodiment. Thus, boost values can be calculated by subtracting a particular voltage associated with the threshold voltage value (L5 in this example) at each boost step from 2.3V. Table 1 is an example set of boost values for Boost_1 and Boost_2 steps, according to an embodiment. Other Boost values for different Vth and different designs are envisioned.

TABLE 1

| Level | Boost_1 | Boost_2 |
|---|---|---|
| L7 | 0.2 | 0 |
| L6 | 0.4 | 0.2 |
| L5 | 0.6 | 0.4 |
| L4 | 0.8 | 0.6 |
| L3 | 1.0 | 0.8 |
| L2 | 1.2 | 1.0 |
| L1 | 1.4 | 1.2 |
| L0 | 1.6 | 1.4 |

Figure 7A:
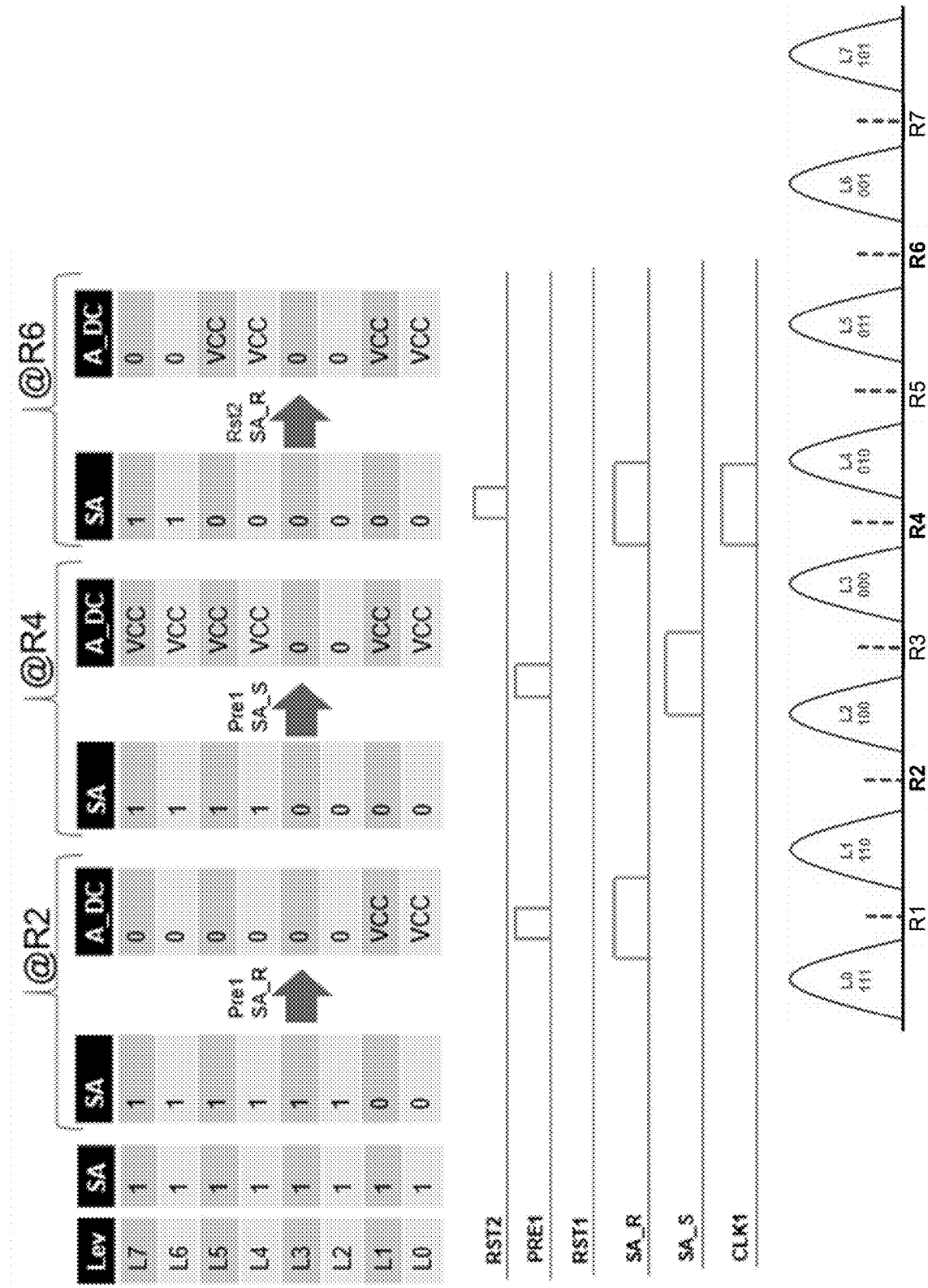
FIG. 7A is a timing chart and a corresponding set of digital and analog values illustrating steps to perform a read operation by the page buffer circuit of FIGS. 3A-3C, in accordance with an embodiment.

FIG. 7A is a timing chart and a corresponding set of digital and analog values illustrating steps to perform a read operation by the page buffer circuit 338 of FIGS. 3A-3C, in accordance with an embodiment. The set of values illustrates how the A_DC and sense amplifier (SA) values behave with reference to possible logical states (e.g., L0 through L7). By way of example, threshold voltage read levels (both digital and analog values) are illustrated with respect to read level valleys, e.g., boundaries between logical states L0 and L1 (@R2), between logical states L3 and L4 (@R4), and between logical states L5 and L6 (@R6), as shown in the inset group of logical states of FIG. 7A. A data value of "1" can be interpreted from an A_DC value of Vcc and a data value of "0" can be interpreted from an A_DC value of Ground (GND) depending on the logical state of the cell that is coupled with the page buffer circuit 338. These values can be exchanged depending on whether SA_R or SA_S of the latch 332 is being asserted (see SA 308 in FIG. 3B).

The timing chart of FIG. 7A is representative of possible logical states of the memory cell (e.g., L0 through L7) and includes tracking of the pre-charge signal (PRE1) and the discharge signal (RST2) in relation to the reset signal (SA_R) and the set signal (SA_S) of the latch 332 of the SA 308. As these signals are asserted as illustrated, the bits read out of the memory array 302 are converted to an analog voltage value (A_DC), which is stored in the first capacitor, C1. The progression of the analog voltage values for three read levels (R2, R4, R6) is illustrated by way of example only. The analog voltage values can be stored, in turn, in the first capacitor C1 for a period of time until the bits of data are transmitted out to the I/O data line 314.

Figure 7B:
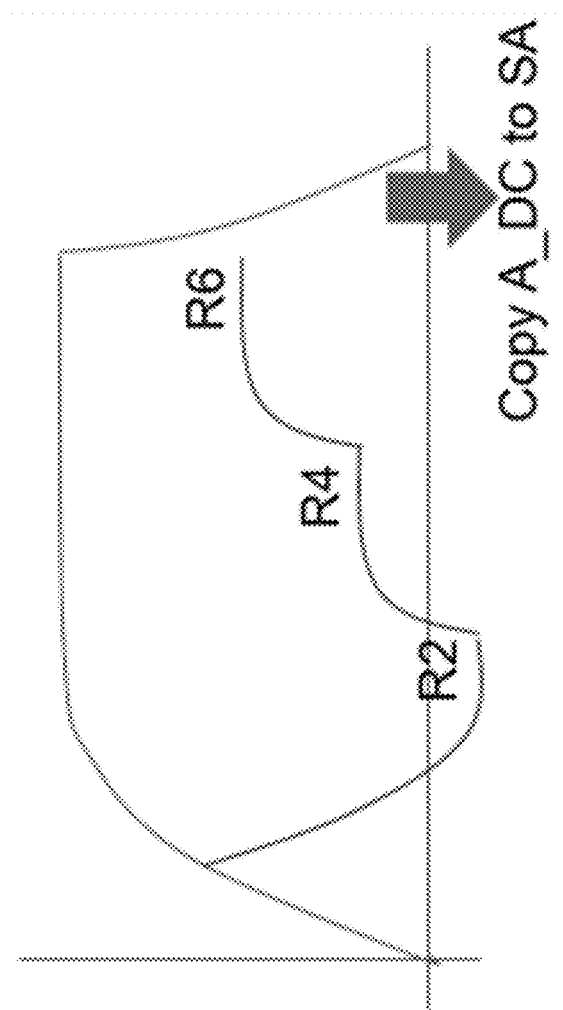
FIG. 7B is a graph illustrating different analog voltage read levels to be copied to the sense amplifier of the page buffer circuit to be sent out on an I/O data line, in accordance with an embodiment.

For example, FIG. 7B is a graph illustrating different analog voltage read levels read out of the memory array 302 to be copied, from the first capacitor (C1), to the sense amplifier (SA) 308 of the page buffer circuit 338 to be sent out on an I/O data line 314, in accordance with an embodiment. In this way, C1 functions to temporarily buffer the digital bits (except as an analog voltage value) during a read operation while waiting to transmit the digital bits, e.g., to the local media controller 135 and/or to the host system 120.

Figure 8A:
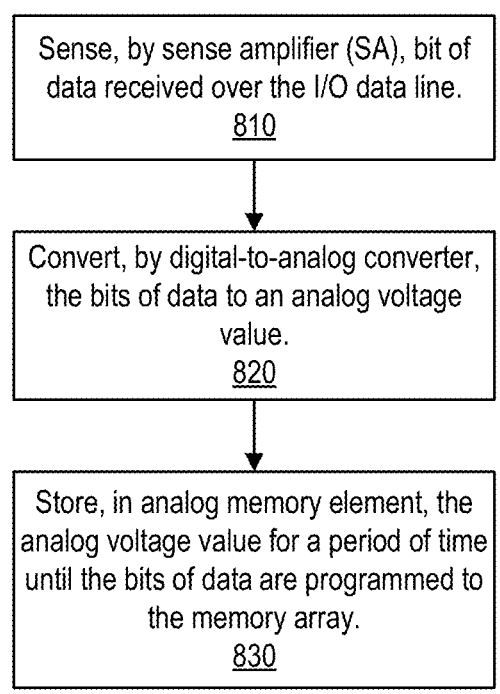
FIG. 8A is a flow diagram of an example method of operating a page buffer circuit, in accordance with an embodiment.

FIG. 8A is a flow diagram of an example method 800A of operating a page buffer circuit, in accordance with an embodiment. The page buffer circuit can be the page buffer circuit 338 of FIG. 3A, including a sense amplifier (SA) coupled with a memory array and an input/output (I/O) data line, a digital-to-analog converter (DAC) coupled with the SA, and an analog memory element coupled with the DAC.

At operation 810, operating the page buffer circuit includes sensing bits of data. For example, operation 810 can include sensing, by the SA, bits of data received over the I/O data line. The SA can be the SA 308 of FIGS. 2A-2C and the bits can be received from the local media controller 135 or the host system 120 over the I/O data line 314.

At operation 820, operating the page buffer circuit includes digital-to-analog conversion. For example, the operation 820 can include converting, by the DAC, the bits of data to an analog voltage value. The DAC can be the DAC 318 in FIG. 3A and FIG. 3B.

At operation 830, operating the page buffer circuit includes storing the analog voltage value. For example, operation 830 can include storing, by the analog memory element, the analog voltage value for a period of time until the bits of data are programmed to the memory array. The analog memory element can be the analog memory element(s) 322 and the memory array can be the memory array 302 discussed with reference to FIGS. 3A-3C.

In further embodiments, the page buffer circuit further includes an analog-to-digital converter (ADC) coupled between the analog memory element and the SA. Additionally, operating the page buffer circuit can further include converting, by the ADC, the analog voltage value to the bits of data and programming, by the SA after the period of time, the bits of data to the memory array.

Figure 8B:
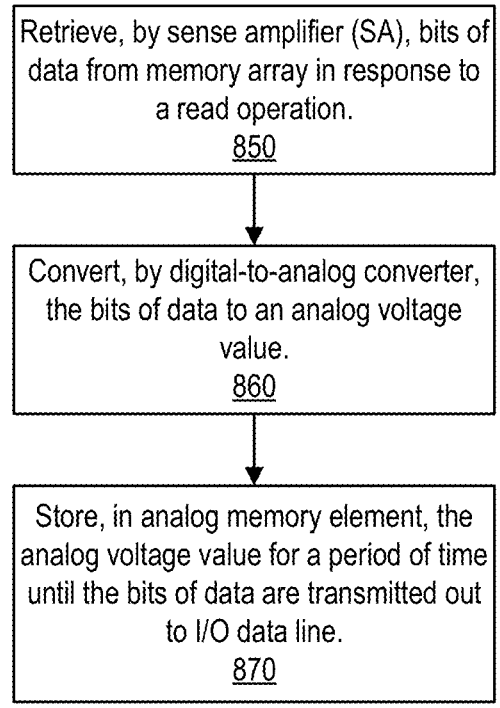
FIG. 8B is a flow diagram of another example method of operating a page buffer circuit, in accordance with an embodiment.

FIG. 8B is a flow diagram of another example method 800B of operating a page buffer circuit, in accordance with an embodiment. The page buffer circuit can be the page buffer circuit 338 of FIG. 3A, including a sense amplifier (SA) coupled with a memory array and an input/output (I/O) data line, a digital-to-analog converter (DAC) coupled with the SA, and an analog memory element coupled with the DAC.

At operation 850, operating the page buffer circuit includes retrieving bits of data. For example, operation 850 can include retrieving, by the SA, bits of data from the memory array in response to a read operation. The SA can be the SA 308 and the memory array can be the memory array 302 of FIGS. 3A-3C.

At operation 860, operating the page buffer circuit includes digital-to-analog conversion. For example, the operation 860 can include converting, by the digital-to-analog converter (DAC), the bits of data to an analog voltage value. The DAC can be the DAC 318 in FIG. 3A and FIG. 3B.

At operation 870, operating the page buffer circuit includes storing the analog voltage value. For example, operation 870 can include storing, in the analog memory element, the analog voltage value for a period of time until the bits of data are transmitted out to I/O data line. The analog memory element can be the analog memory element(s) 322 and the I/O data line can be the I/O data line 314 of FIGS. 3A-3C.

In further embodiments, the page buffer circuit further includes an analog-to-digital converter (ADC) coupled between the analog memory element and the SA. Additionally, operating the page buffer circuit can further include converting, by the ADC, the analog voltage value to the bits of data and transmitting, by the SA after the period of time, the bits of data out to the I/O data line.

Figure 9:
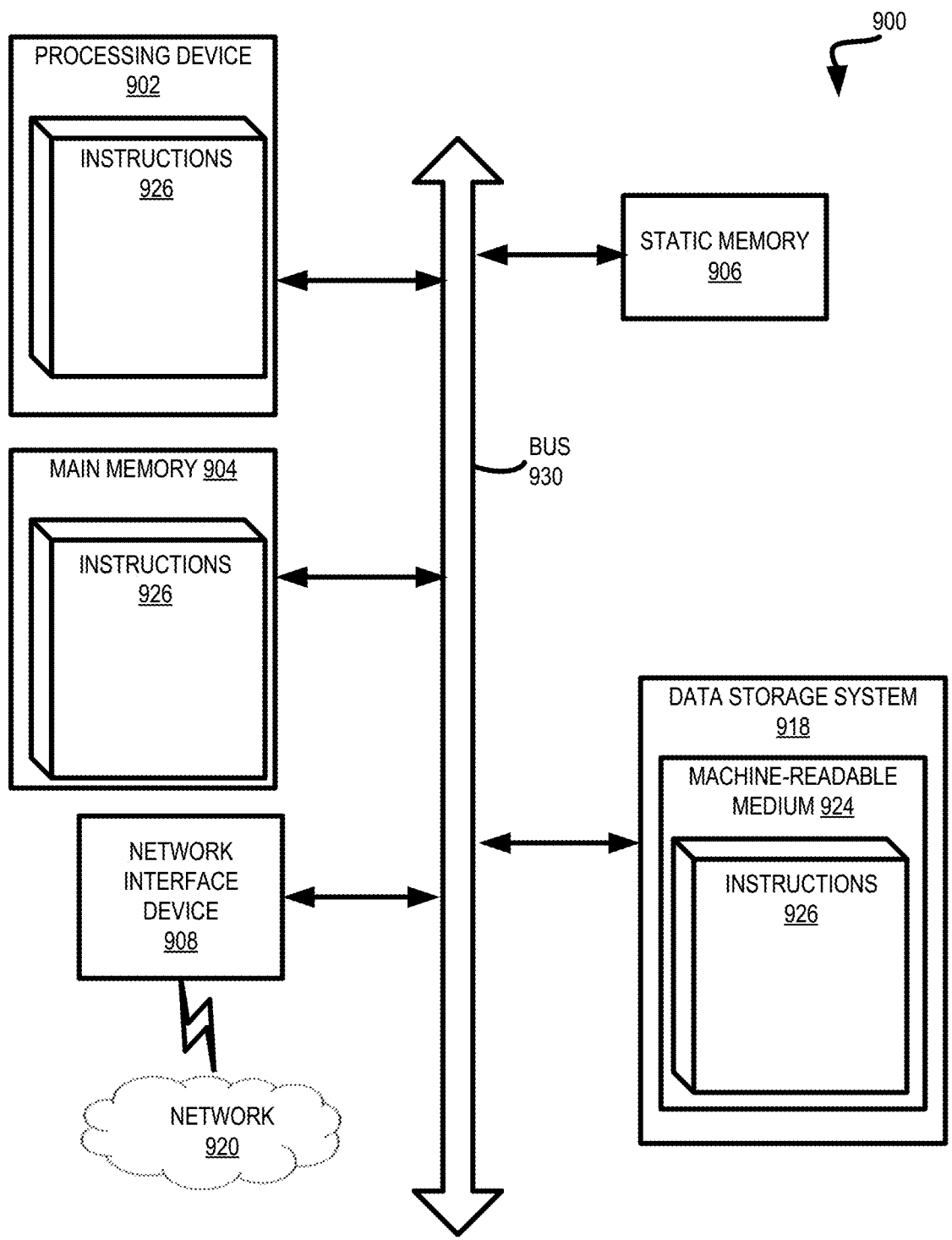
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to functionality of the memory sub-system controller 115 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 910 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 928 for performing the operations and steps discussed herein. The computer system 900 can further include a network interface device 912 to communicate over the network 920.

The data storage system 918 can include a machine-readable storage medium 924 (also known as a computer-readable medium) on which is stored one or more sets of instructions 928 or software embodying any one or more of the methodologies or functions described herein. The instructions 928 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
   a memory array;
   a sense amplifier (SA) coupled with the memory array and with an input/output (I/O) data line, wherein the SA is to receive bits of data over the I/O data line in association with a program operation;
   a digital-to-analog converter (DAC) coupled with the SA, the DAC to convert the bits of data to an analog voltage value; and
   an analog memory element coupled with the DAC, the analog memory element to store the analog voltage value for a period of time; and
   an analog-to-digital converter (ADC) coupled between the analog memory element and the SA, wherein the ADC is to, after the period of time, convert the analog voltage value to the bits of data, and wherein the SA is to program the bits of data to the memory array.

2. The device of claim 1, wherein the bits of data comprise a page of data to be stored in the memory array.

3. The device of claim 1, wherein the analog memory element is a capacitor.

4. The device of claim 3, wherein the device is an integrated circuit device, and wherein the capacitor is located within a substrate of the integrated circuit device.

5. The device of claim 3, wherein the capacitor is between 7 and 9 femtofarads in size.

6. The device of claim 3, wherein the capacitor is a first capacitor, further comprising:
- a pre-charge transistor coupled with a voltage supply and the first capacitor, the pre-charge transistor to charge the first capacitor to an initial voltage level;
- a second capacitor coupled in parallel with the first capacitor and being four to 20 times smaller than the first capacitor; and
- transistor logic coupled between the first capacitor and the second capacitor, the transistor logic to selectively enable the second capacitor to consume charge from the first capacitor until the first capacitor stores the analog voltage value.

7. The device of claim 6, wherein the transistor logic comprises a clock-enabled transistor and an SA-enabled transistor.

8. The device of claim 6, wherein the transistor logic comprises a discharge transistor coupled with the second capacitor to discharge the second capacitor of the consumed charge from the first capacitor.

9. A device comprising:
- a memory array;
- a sense amplifier (SA) coupled with the memory array and with an input/output (I/O) data line, wherein the SA is to retrieve bits of data from the memory array in response to a read operation;
- a digital-to-analog converter (DAC) coupled with the SA, the DAC to convert the bits of data to an analog voltage value; and
- an analog memory element coupled with the DAC, the analog memory element to store the analog voltage value for a period of time until the bits of data are transmitted out to the I/O data line.

10. The device of claim 9, wherein the bits of data comprise a page of data stored in the memory array.

11. The device of claim 9, further comprising an analog-to-digital converter (ADC) coupled between the analog memory element and the SA, wherein the ADC is to, after the period of time, convert the analog voltage value to the bits of data, and wherein the SA is to transmit the bits of data out via the I/O data line.

12. The device of claim 9, wherein the analog memory element is a capacitor.

13. The device of claim 12, wherein the device is an integrated circuit device, and wherein the capacitor is located within a substrate of the integrated circuit device.

14. The device of claim 12, wherein the capacitor is between 7 and 9 femtofarads in size.

15. The device of claim 12, wherein the capacitor is a first capacitor, further comprising:
- a pre-charge transistor coupled with a voltage supply and the first capacitor, the pre-charge transistor to charge the first capacitor to an initial voltage level;
- a second capacitor coupled in parallel with the first capacitor and being four to 20 times smaller than the first capacitor; and
- transistor logic coupled between the first capacitor and the second capacitor, the transistor logic to selectively enable the second capacitor to consume charge from the first capacitor until the first capacitor stores the analog voltage value.

16. The device of claim 15, wherein the transistor logic comprises a clock-enabled transistor and an SA-enabled transistor.

17. The device of claim 15, wherein the transistor logic comprises a discharge transistor coupled with the second capacitor to discharge the second capacitor of the consumed charge from the first capacitor.

18. A method comprising:
- operating a page buffer circuit that comprises a sense amplifier (SA) coupled with a memory array and an input/output (I/O) data line, a digital-to-analog converter (DAC) coupled with the SA, an analog memory element coupled with the DAC, and an analog-to-digital converter (ADC) coupled between the analog memory element and the SA, wherein operating the page buffer circuit comprises:
  - sensing, by the SA, bits of data received over the I/O data line;
  - converting, by the DAC, the bits of data to an analog voltage value;
  - storing, in the analog memory element, the analog voltage value for a period of time;
  - converting, by the ADC, the analog voltage value to the bits of data; and
  - programming, by the SA after the period of time, the bits of data to the memory array.

* * * * *